United States Patent [19]
Craps

[11] Patent Number: 5,508,888
[45] Date of Patent: Apr. 16, 1996

[54] ELECTRONIC COMPONENT LEAD PROTECTOR

[75] Inventor: Terry Craps, Lexington, S.C.

[73] Assignee: AT&T Global Information Solutions Company, Dayton, Ohio

[21] Appl. No.: 240,058

[22] Filed: May 9, 1994

[51] Int. Cl.[6] .................................................. H01R 9/00
[52] U.S. Cl. .......................... 361/773; 361/776; 361/813; 174/52.4
[58] Field of Search .................................. 361/773, 774, 361/760, 761, 776, 816, 813, 212, 220; 174/52.4, 261; 257/693, 694, 666

[56] References Cited

U.S. PATENT DOCUMENTS

| | | |
|---|---|---|
| 3,405,441 | 10/1968 | Asher et al. . |
| 3,544,857 | 12/1970 | Byrne et al. . |
| 3,597,839 | 8/1971 | Jaccodine . |
| 3,729,820 | 5/1973 | Ihochi et al. . |
| 3,768,157 | 10/1973 | Buie . |
| 3,872,583 | 3/1975 | Beall et al. . |
| 4,510,677 | 4/1985 | Collumeau . |
| 4,715,115 | 12/1987 | King et al. . |
| 4,784,974 | 11/1988 | Butt . |
| 4,897,602 | 1/1990 | Lin et al. . |
| 5,037,779 | 8/1991 | Whalley et al. . |
| 5,106,785 | 4/1992 | Rauchmaul et al. . |
| 5,109,269 | 4/1992 | Holzman ................................ 357/74 |
| 5,221,812 | 6/1993 | Long . |

FOREIGN PATENT DOCUMENTS

| | | |
|---|---|---|
| 52-31673 | 10/1977 | Japan . |
| 281540 | 12/1986 | Japan . |

OTHER PUBLICATIONS

McConaghy et al., "Hybrid Circuit Package", IBM Technical Disclosure Bulletin, vol. 9, No. 11, Apr. 1967, pp. 1518 and 1519.

Honn, "Eighty–Pin Package for Field–Effect Transistor Chips", IBM Technical Disclosure Bulletin, vol. 15, No. 1, Jun. 1972, p. 308.

Primary Examiner—Leo P. Picard
Assistant Examiner—Y. Whang
Attorney, Agent, or Firm—Albert L. Sessler, Jr.

[57] ABSTRACT

A mechanical component peripheral lead protector covers fine pitch component leads in such a manner that nothing can come into contact with them. The lead protector is disposed above the component having the leads. It can be made of aluminum, conductive plastic or any other non ESD (electric static discharge) generating material. It can be glued, snapped, bolted or riveted to the associated PC board or glued to the top of the component, depending upon the application in which it is being used. The attachment method should be one which enables it to be removed and replaced when necessary. The center of the lead protector can be provided with an aperture so that the legends on the top of the component will be exposed.

14 Claims, 2 Drawing Sheets

ELECTRONIC COMPONENT LEAD PROTECTOR

BACKGROUND OF THE INVENTION

The present invention relates generally to an electronic component lead protector, and more particularly relates to such a lead protector which is positioned above a semiconductor component having fine pitch component leads, the lead protector being positioned over the electronic component and extending outwardly over said leads.

As components produced by the electronics industry become more complex, with higher speeds, more I/O, more density, lower cost, and less weight, the integrated circuit pitches (that is, the spacing between the center line of one lead to the center line of the adjacent lead) are becoming smaller (closer together). The normal surface mount lead pitch currently used is approximately 50 mils. With the advent of TAB (tape automated bonding) and other advanced component packaging concepts, some board designs are incorporating components with lead pitches down to 0.2 mm (approximately 8 mil). The cross section of one of these 0.2 mm. leads is approximately 1.5×3 mil, which is close to the size of a human hair. When leads are this small and this close together, they become very susceptible to mechanical damage due to handling and other assembly processing after they are attached to the circuit board. The use of these fine pitch components in the electronics industry is quite new at this time, so that these problems are just now becoming apparent. Conformable coatings, such as those used in automotive and military applications, will solve the problem, but hinder the reworkability of the components. A mechanical lead protector that can be removed for inspection and repair would thus be very desirable.

SUMMARY OF THE INVENTION

In accordance with the present invention, there is provided an electronic device comprising a semiconductor component, a plurality of leads extending from said component, and a protective device positioned over said component and extending outwardly therefrom over said leads. The planar device may be either planar in shape and attached to the top of the semiconductor component, or may be of a shape which extends over the semiconductor component and its leads, and is secured to a printed circuit board on which the semiconductor component is positioned.

It is accordingly an object of the present invention to provide a protective device which prevents damage to leads associated with a semiconductor component.

It is another object of the present invention to provide an electronic component lead protector for use with fine pitch component leads.

It is another object of the present invention to provide an electronic assembly which includes a circuit board, a semiconductor component on the circuit board, a plurality of leads extending from the component to the circuit board and a protective device positioned over the semiconductor component and extending outwardly therefrom over the leads to protect the leads against damage.

Another object is to provide an electronic device which includes a protective device positioned over an electronic component having a plurality of leads extending therefrom, said protective device extending over said leads.

Additional benefits and advantages of the present invention will become apparent to those skilled in the art to which this invention relates from the subsequent description of the preferred embodiments and the appended claims, taken in conjunction with the accompanying drawings.

DETAILED DESCRIPTION

Figure 1:
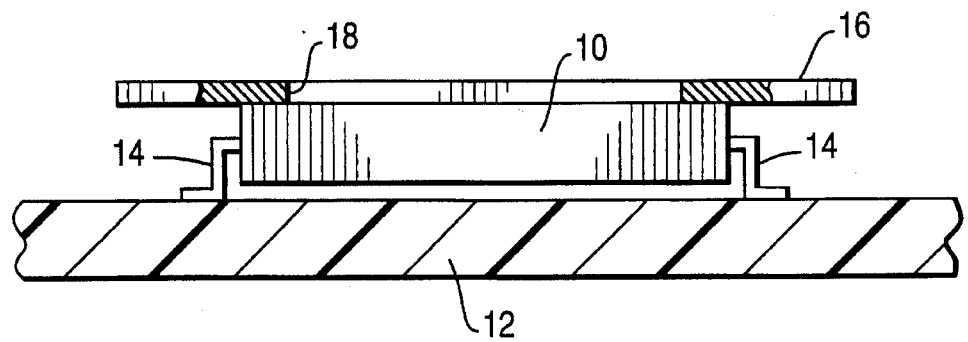
FIG. 1 is an elevation view of a semiconductor component having fine pitch leads mounted on a circuit board with a protective device in accordance with one embodiment of the invention secured to the upper surface of the semiconductor component.
Figure 2:
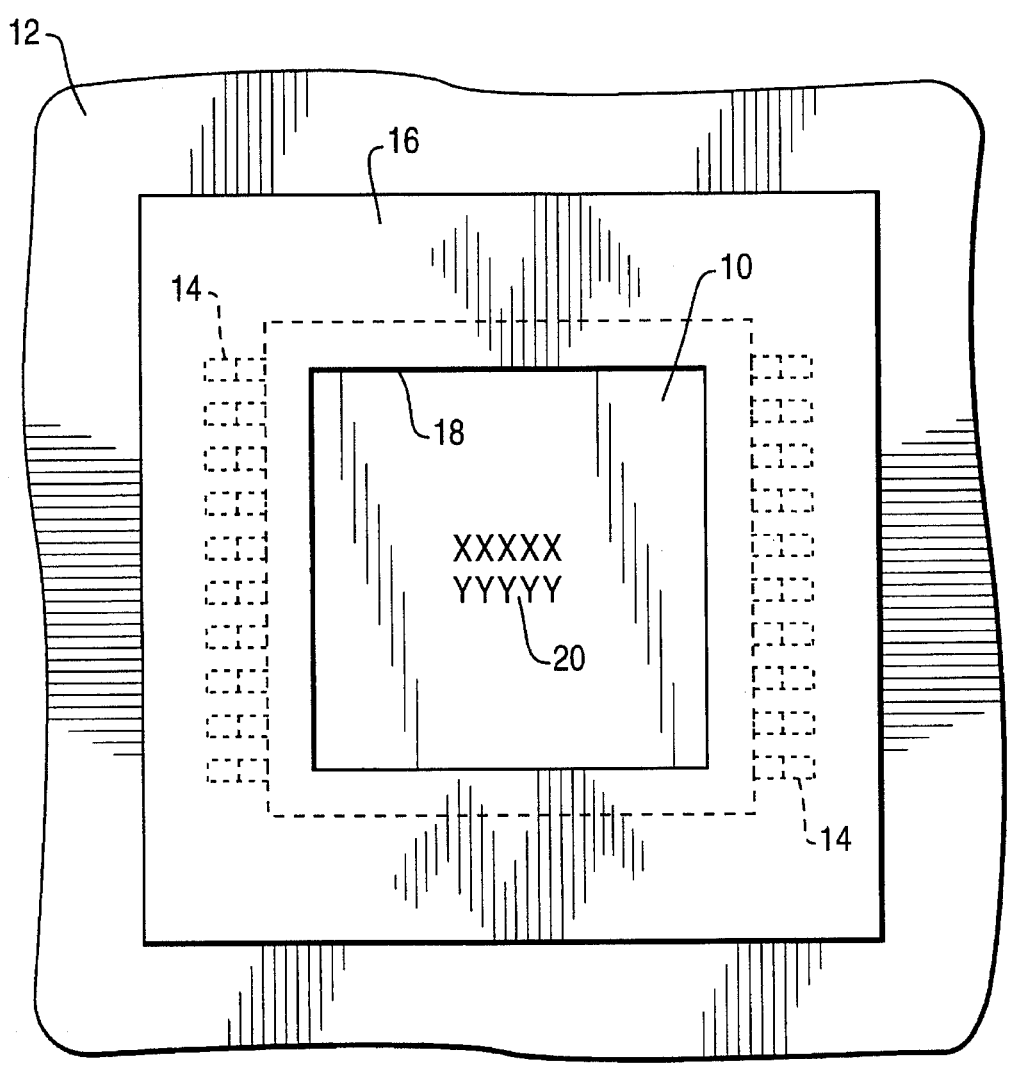
FIG. 2 is a plan view of the embodiment of FIG. 1.

Referring now to FIGS. 1 and 2, shown there is an electronic component 10, which may typically be a high-speed complex chip that requires the use of fine pitch component leads 14. Such leads may have a lead pitch as little as 0.2 mm (approximately 8 mil) and may have a very small cross-section, such as approximately 1.5 mil×3 mil. The leads are connected at one end to the component 10 and at the other end to the printed circuit board 12 on which the component 10 is mounted.

The small dimensions and fine pitch of these leads means that they are relatively fragile and susceptible to damage from being touched, as could happen, for example during handling of the printed circuit board. In order to prevent such damage, a peripheral lead protector 16 is provided. The lead protector 16 is planar in configuration, and in the embodiment of FIGS. 1 and 2, is fastened directly to the top surface of the component 10 by gluing or some equivalent means. If desired, a central aperture 18 may be provided in the lead protector 16, so that a legend printed on the top surface of the component 10, such as the legend 20, may be viewed even with the lead protector 16 in place.

The lead protector 16 can be made of aluminum, conductive plastic or any other non-ESD (electric static discharge) generating material.

Figure 3:
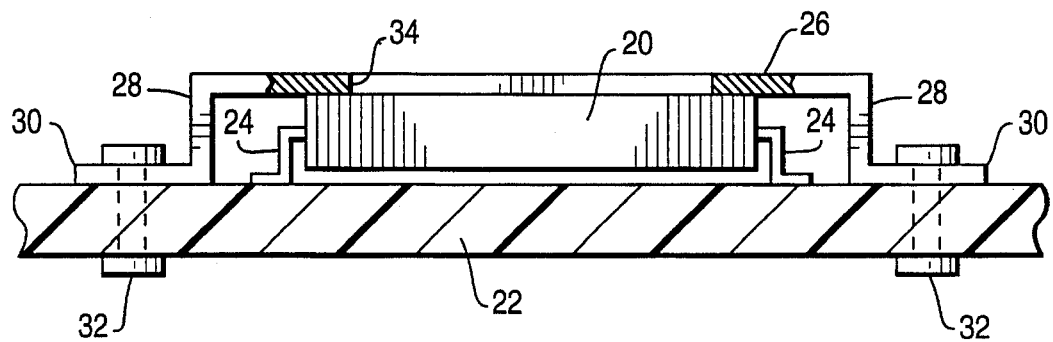
FIG. 3 is an elevation view of a second embodiment of the invention, in which the protective device is secured to the printed circuit board.
Figure 4:
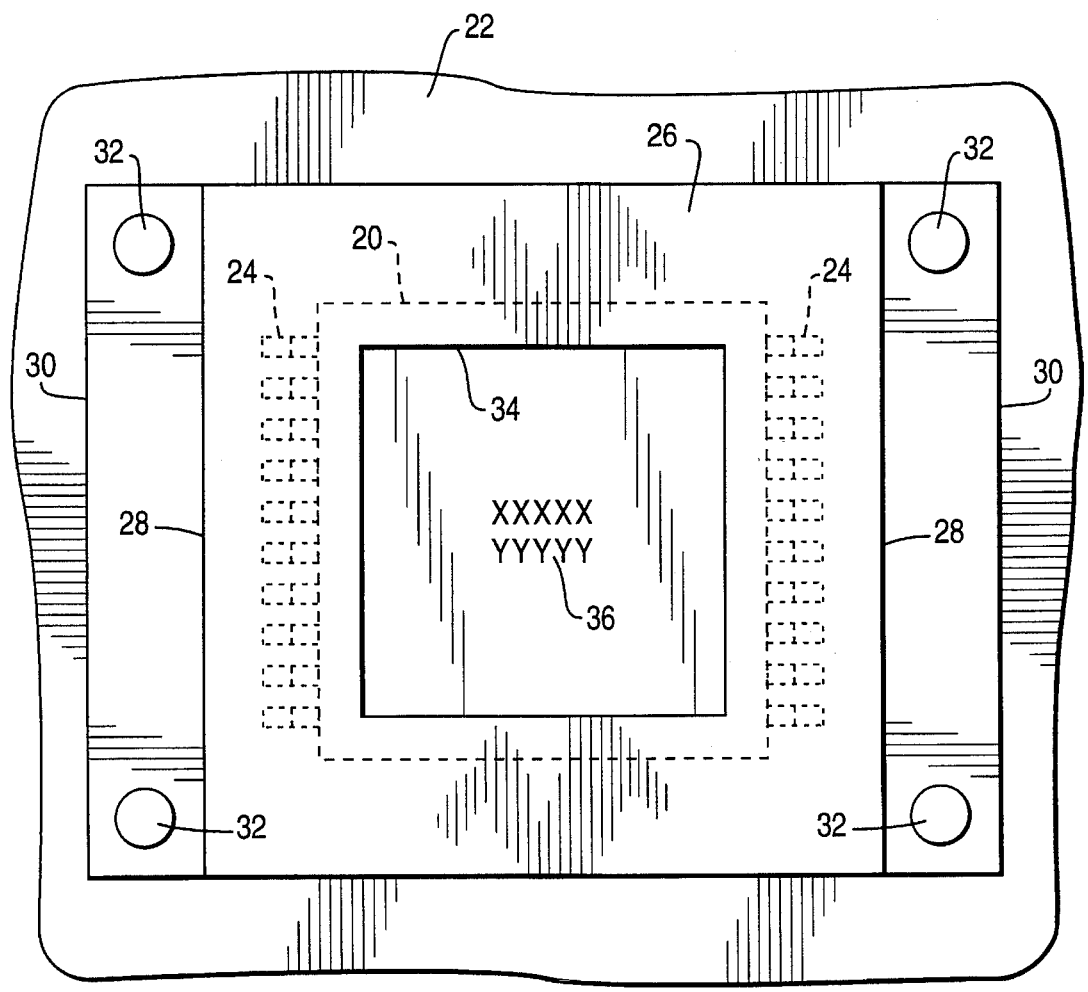
FIG. 4 is a plan view of the embodiment of FIG. 3.

A second embodiment of the invention is shown in FIGS. 3 and 4. In this embodiment, an electronic component 20 is mounted on a printed circuit board 22 by leads 24, which may be of the same fine pitch type as described above in connection with the embodiment of FIGS. 1 and 2. In this embodiment a lead protector 26 is employed, is positioned above the component 20, and extends outwardly sufficiently to protect the leads 24. However in this embodiment, the lead protector is not fastened to the top surface of the component 20, but instead is secured to the printed circuit board 22 by suitable fastening means. For example, the lead protector 26 can be glued, snapped, bolted or riveted to the printed circuit board 22. In the embodiment shown in FIGS. 3 and 4, the lead protector 26 has an inverted U-shape cross-section, with downward extending portions 28 and flanges 30 at the lower ends of the portions 28. The flanges 30 are apertured to receive rivets 32 which also extend through apertures in the printed circuit board 22 in order to fasten the lead protector 26 to the board 22. The arrangement of FIGS. 3 and 4 has the added advantage that the downwardly extending portions provide additional shielding against contact with the leads 24. The lead protector 26 may be apertured to provide an opening 34 through which a legend 36 on the top surface of the component 20 is visible.

Although the invention has been described with particular reference to preferred embodiments thereof, variations and modifications of the present invention can be effected within the spirit and scope of the following claims.

What is claimed is:

1. An electronic device, comprising:
a semiconductor component;
a plurality of leads extending from said component; and
a protective device positioned over said component and extending outwardly therefrom over said leads, said protective device being made of a non-ESD (electric static discharge) generating material.

2. An electronic device, comprising:
a semiconductor component;
a plurality of leads extending from said component; and
a protective device positioned over said component and extending outwardly therefrom over said leads, said protective device being made of a conductive plastic.

3. An electronic device, comprising:
a semiconductor component;
a plurality of leads extending from said component; and
a protective device positioned over said component and extending outwardly therefrom over said leads, said protective device being secured to a printed circuit board on which the semiconductor component is positioned.

4. An electronic device, comprising;
a semiconductor component;
a plurality of leads extending from said component; and
a protective device positioned over said component and extending outwardly therefrom over said leads, said protective device having an inverted U-shape in cross-section, extends past the leads, and being secured to a printed circuit board on which the semiconductor is positioned and to which the leads are connected.

5. An electronic device, comprising:
a semiconductor component;
a plurality of fine pitch component leads extending from said component; and
a protective device positioned over said component and extending outwardly therefrom over said leads;
said leads having a cross-section of approximately 1.5 mil by 3 mil, and in which the lead pitch is approximately 8 mil.

6. An electronic device, comprising:
a semiconductor component;
a plurality of fine pitch, fine cross-section leads extending from said component; and
a protective device made of a non-electric static-discharge-generating material and having an inverted U-shape in cross-section extending past said leads and having flanges to enable said protective device to be secured to a printed circuit board on which said component is positioned and to which said leads are connected.

7. An electronic assembly, comprising:
a printed circuit board;
a semiconductor component;
a plurality of leads extending from said semiconductor component to said circuit board; and
a protective device positioned over said semiconductor component and extending outwardly therefrom over said leads to protect said leads against unintended contact;
said protective device being made of a non-ESD (electric static discharge) generating material.

8. An electronic assembly, comprising:
a printed circuit board;
a semiconductor component;
a plurality of leads extending from said semiconductor component to said circuit board; and
a protective device positioned over said semiconductor component and extending outwardly therefrom over said leads to protect said leads against unintended contact;
said protective device being made of a conductive plastic.

9. An electronic assembly, comprising:
a printed circuit board;
a semiconductor component;
a plurality of leads extending from said semiconductor component to said circuit board; and
a protective device positioned over said semiconductor component and extending outwardly therefrom over said leads to protect and leads against unintended contact;
said protective device having an inverted U-shape in cross-section, extends past the leads, and being secured to the printed circuit board to which the leads are connected.

10. An electronic assembly, comprising:
a printed circuit board;
a semiconductor component;
a plurality of leads extending from said semiconductor component to said circuit board; and
a protective device positioned over said semiconductor component and extending outwardly therefrom over said leads to protect said leads against unintended contact;
said leads having a cross-section of approximately 1.5 mil×3 mil, and in which the lead pitch is approximately 8 mil.

11. An electronic component peripheral lead protector which is positionable above an electronic component and which has a surface extending outwardly beyond the electronic component and over leads which are connected to said component;
said lead protector having an inverted U-shape in cross-section and being provided with flanges for securing it to a printed circuit board.

12. An electronic component peripheral lead protector which is positionable above an electronic component and which has a surface extending outwardly beyond the electronic component and over leads which are connected to said component;
said lead protector including a central aperture to permit a legend on the component to be read.

13. An electronic component peripheral lead protector which is positionable above an electronic component and which has a surface extending outwardly beyond the electronic component and over leads which are connected to said component;
said lead protector being made of a non-ESD (electric static discharge) generating material.

14. An electronic component peripheral lead protector which is positionable above an electronic component and which has a surface extending outwardly beyond the electronic component and over leads which are connected to said component;
said lead protector being made of a conductive plastic.

* * * * *